(12) United States Patent
Huang et al.

(10) Patent No.: US 7,094,068 B2
(45) Date of Patent: Aug. 22, 2006

(54) LOAD BOARD

(75) Inventors: Ching-Jung Huang, Hsinchu (TW); Hsiu-Chu Chou, Hsinchu (TW); Mu-Sheng Liao, Hsinchu (TW); Fu-Tsai Chen, Hsinchu (TW); Pao-Chuan Kuo, Kaohsiung (TW)

(73) Assignee: Silicon Integrated Systems Corp., Hsinchu (TW)

( * ) Notice: Subject to any disclaimer, the term of this patent is extended or adjusted under 35 U.S.C. 154(b) by 0 days.

(21) Appl. No.: 10/637,588

(22) Filed: Aug. 11, 2003

(65) Prior Publication Data

US 2005/0037638 A1   Feb. 17, 2005

(51) Int. Cl.
*H01R 12/00* (2006.01)

(52) U.S. Cl. .................. 439/70; 439/72; 174/260; 361/774

(58) Field of Classification Search .................. 439/70, 439/72, 78, 83, 876; 174/260, 261, 257; 361/774, 777
See application file for complete search history.

(56) References Cited

U.S. PATENT DOCUMENTS

| | | | | |
|---|---|---|---|---|
| 5,067,007 A | * | 11/1991 | Otsuka et al. | 257/701 |
| 5,563,509 A | * | 10/1996 | Small | 324/158.1 |
| 5,731,547 A | * | 3/1998 | Derwin et al. | 174/251 |
| 5,866,941 A | * | 2/1999 | Lacap | 257/697 |
| 6,262,477 B1 | * | 7/2001 | Mahulikar et al. | 257/698 |
| 6,262,583 B1 | * | 7/2001 | Martin et al. | 324/755 |
| 6,293,808 B1 | * | 9/2001 | Ochiai | 439/70 |
| 6,740,352 B1 | * | 5/2004 | Lee et al. | 427/96.2 |
| 6,760,223 B1 | * | 7/2004 | Wells et al. | 361/704 |

FOREIGN PATENT DOCUMENTS

TW           466656           1/1989

* cited by examiner

*Primary Examiner*—Briggitte Hammond
*Assistant Examiner*—X. Chung-Trans
(74) *Attorney, Agent, or Firm*—Birch, Stewart, Kolasch & Birch, LLP

(57) ABSTRACT

A load board for packaged IC testing. The load board with predetermined testing circuit thereon has bonding pad areas on its surface. A plurality of bonding pads is formed on the bonding pad areas, each of which is disposed corresponding to a lead of a packaged IC for testing connection, such as a quad flat packaged IC (QFP), a dual inline packaged IC (DIP) or a small outline packaged IC (SOP). The bonding pads on the load board connect the leads of the testing IC directly during IC testing, thus the conventional test socket between a conventional load board and a packaged IC is omitted.

4 Claims, 6 Drawing Sheets

LOAD BOARD

BACKGROUND OF THE INVENTION

1. Field of the Invention

The present invention relates to IC (integrated circuits) packaging, and in particular to load boards for packaged IC testing.

2. Description of the Related Art

Various electronics packaging has been developed to accommodate diverse integrated circuits (IC). Simple packaging, such as dual in-line packaging (DIP) or plastic leaded chip carrier (PLCC), and sophisticated packaging, such as quad flat packaging (QFP) with dense leads, have been developed for different circuitries. For example, FIG. 1A shows an IC chip 16 packaged by quad flat packaging (QFP). There are leads 18 disposed along the four sides of the IC chip 16. The leads 18 on the IC chip 16 are usually formed in L-shaped or gullwing configurations as shown in FIG. 1B.

There are several types of quad flat packaging, such as plastic quad flat packaging (PQFP), low-profile QFP (LQFP) and thin QFP (TQFP). Plastic quad flat packaging (PQFP) is utilized in large scale or very large scale integrated circuit packaging. The leads of PQFP are thin, dense and usually over 100 in number.

The low-profile QFP (LQFP) is a low-profile and lightweight package designed for application-specific integrated circuits, digital signal processors, microprocessors, controllers, graphic processors, gate arrays, synchronous static random access memories (SSRAM), computer chipsets and mixed-signal devices.

Thin quad flat packaging (TQFP) provides a space-efficient packaging solution, resulting in smaller printed circuit board space requirements. Reduced height and body dimensions are ideal for space-conscious applications, such as PCMCIA cards and networking devices.

Package testing is the final point at which chips are tested to ensure function as designed before delivery.

Conventionally, a handler in a material handling system takes packaged IC chips from their carriers, loads them into testing sockets and sets the environmental temperature as specified. Each pin on the chip's package must be inserted into the socket coupled to a custom designed circuit board known as a DUT board or a load board. The load board is then coupled to a functional tester or automatic test equipment (ATE), which provides an interface to output electric signals from the pins of the packaged IC chips. The functional tester or automatic test equipment (ATE) is capable of functionally exercising all of the chip's designed features under software control. Any failure to meet the published specification is identified by the tester.

FIG. 2 shows a quad flat packaged (QFP) IC chip bonded to a conventional load board via a test socket as an interface apparatus. The leads 28 of an IC 26 packaged by quad flat packaging (QFP) are usually very small and dense. The leads 28 are inserted in socket holes (not shown) or electrically contacting the socket 24. The socket 24 is then electrically coupled to the load board 20 via the connecting units 22 for testing. A conventional test socket 24 with simple circuit layout provides an interface for electrical connection of the leads 28 and a load board 20.

A drawback is that each type of packaged IC chips requires a customized socket to couple to a corresponding load board.

SUMMARY OF THE INVENTION

The object of the present invention is to provide a load board to bond to a packaged IC directly for IC testing, skipping conventional testing sockets.

To achieve the object, the present invention provides a load board with a predetermined testing circuit thereon and bonding pad areas disposed on the surface. A plurality of bonding pads is formed on the bonding pad areas, each of which is disposed corresponding to a lead of a packaged IC for testing connection, such as a quad flat packaged IC (QFP), a dual inline packaged (DIP) IC or a small outline packaged (SOP) IC. The bonding pads on the load board connect the leads of the testing IC directly during IC testing and therefore a conventional test socket between a conventional load board and a packaged IC is omitted.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1A:
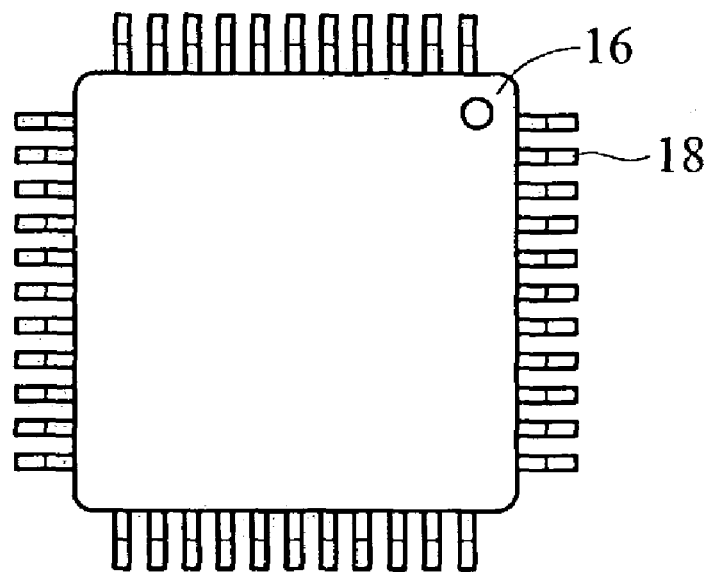
FIG. 1A is a top view of a conventional quad flat packaged (QFP) IC chip and leads thereof.
Figure 1B:
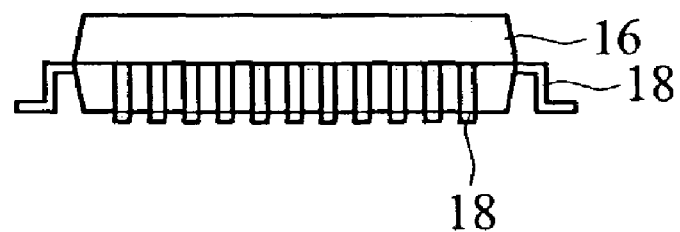
FIG. 1B is a cross-section of the conventional quad flat packaged (QFP) IC chip and leads in FIG. 1A.
Figure 2:
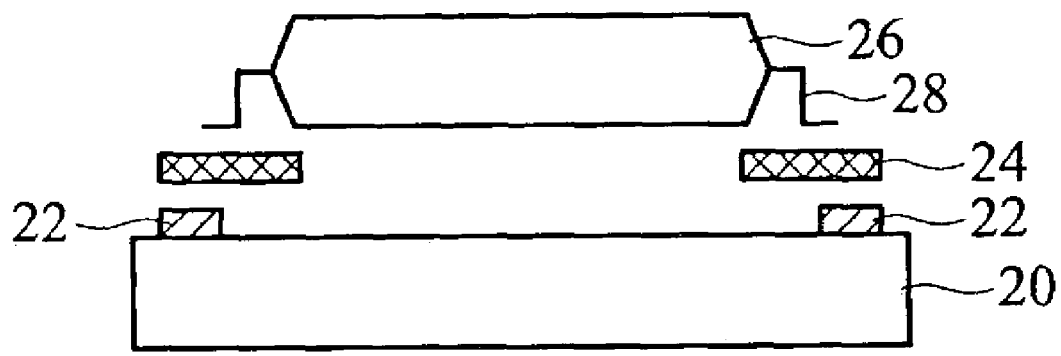
FIG. 2 is a cross-section of a quad flat packaged (QFP) IC chip bonding to a conventional load board via a test socket as an interface apparatus.
Figure 3A:
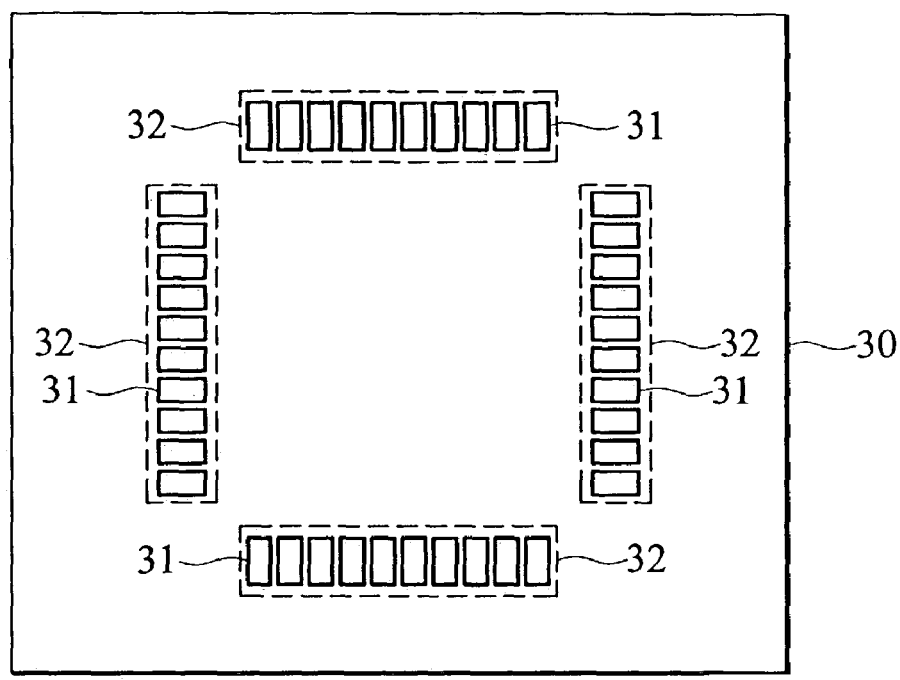
FIG. 3A is a top view of a load board of the invention with four bonding pad areas and bonding pads thereon.
Figure 3B:
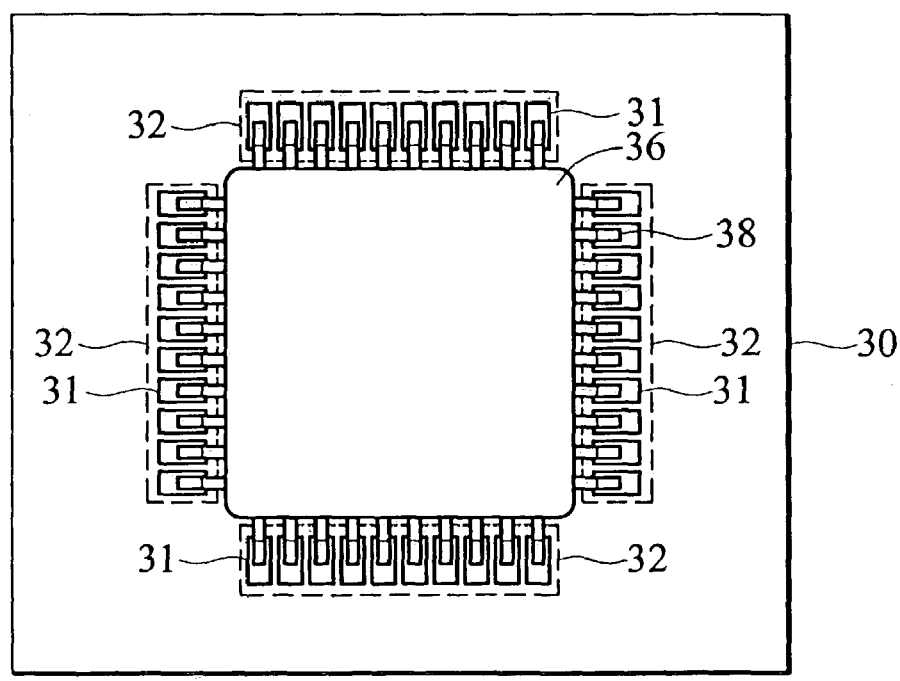
FIG. 3B is a top view of a quad flat packaged IC chip directly bonding to the load board in FIG. 3A.
Figure 3C:
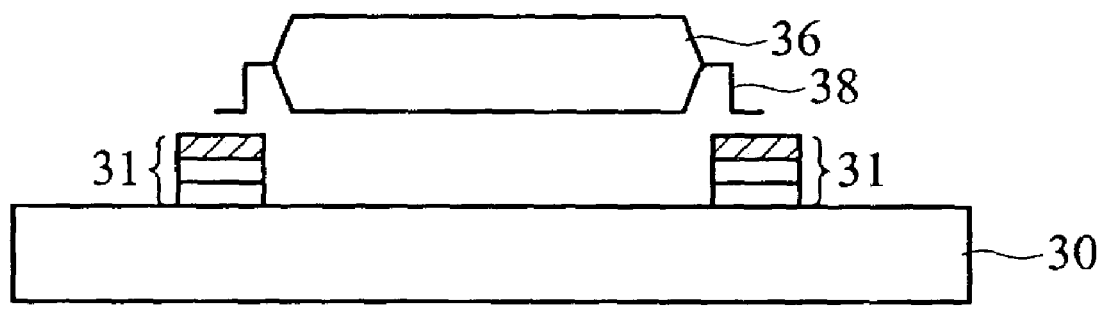
FIG. 3C is a cross-section of the packaged IC chip directly bonding to the load board in FIG. 3B.

FIGS. 3A to 3C show a load board of the invention bonding with a quad flat packaged IC chip.

FIG. 3A is a top view of a load board 30 designed for a quad flat packaged IC chip. The load board 30 has a testing circuit thereon (not shown) and four bonding pad areas 32 on the surface corresponding to four sides of a quad flat packaged IC chip respectively. Bonding pads 31 are disposed on the bonding pad areas 32. The bonding pads 31 are disposed corresponding to the leads of the quad flat packaged IC chip. FIG. 3B shows a quad flat packaged IC chip 36 directly bonding to the load board 30 by subjecting the leads 38 on the four sides of the chip 36 in contact with corresponding bonding pads 31 on the load board 30.

FIG. 3C is a cross-section of the QFP IC chip 36 directly bonding to the load board 30 in FIG. 3B. In a preferred embodiment, the bonding pads 31 are composed of a copper layer, a nickel layer and a gold layer sequentially formed on the surface of the load board 30 to improve the bonding quality of the bonding pads 31 and the tiny leads 38. The thickness of the gold layer in bonding pads of a conventional socket is only about 20 μm. According to the invention, the preferred thickness of the gold layer in the bonding pads 31 is between 90 μm to 120 μm to provide sufficient bonding support.

Second Embodiment

Figure 4A:
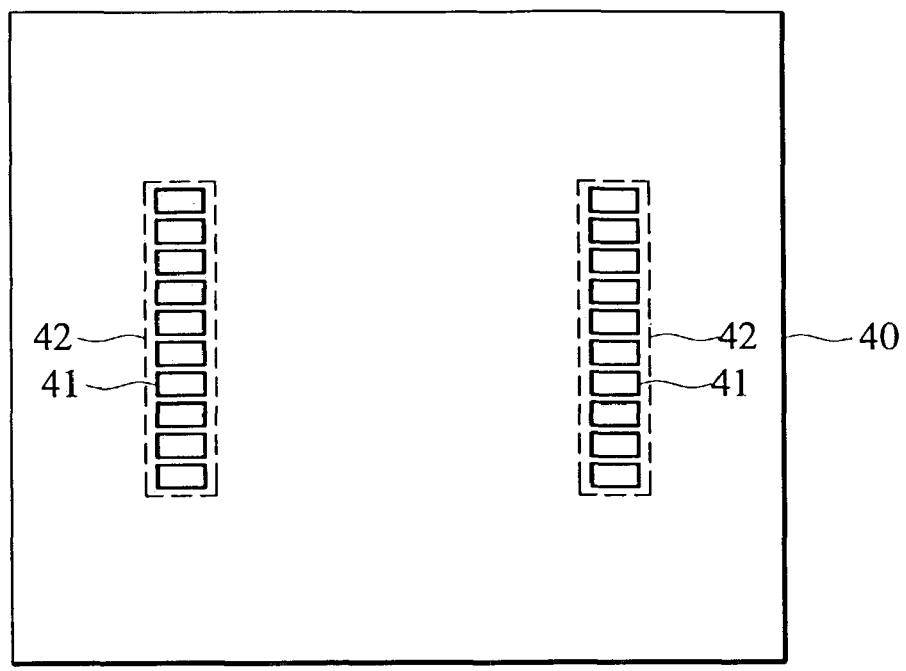
FIG. 4A is a top view of a load board of the invention with two bonding pad areas and bonding pads thereon.
Figure 4B:
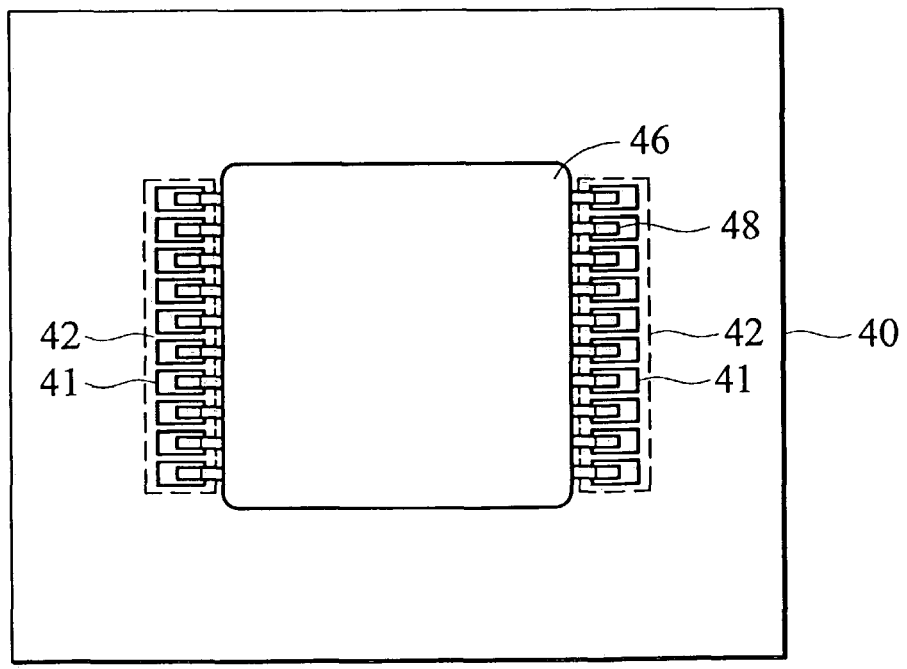
FIG. 4B is a top view of a dual inline packaged IC chip directly bonding to the load board in FIG. 4A.

FIGS. 4A and 4B show another load board of the invention.

FIG. 4A is a top view of a load board 40 designed for a dual inline packaged (DIP) IC chip or a small outline packaged (SOP) IC chip. The load board 40 has a testing circuit thereon (not shown) and two bonding pad areas 42 on the surface corresponding to two parallel sides of a dual inline packaged (DIP) IC chip respectively. Bonding pads 41 are disposed on the bonding pad areas 42. Each of the bonding pads 42 is disposed corresponding to a leads of dual inline packaged (DIP) IC chip. FIG. 4B shows a DIP IC chip 46 with leads on the two parallel sides directly bonding to the load board 40 by subjecting the leads 48 on the two sides of the chip 46 in contact with corresponding bonding pads 41 on the load board 40.

In a preferred embodiment, the bonding pads 41 are composed of a copper layer, a nickel layer and a gold layer sequentially formed on the surface of the load board 40 to improve the bonding quality of the bonding pads 41 and the tiny leads 48. The thickness of the gold layer in bonding pads of a conventional socket is only about 20 μm. According to the invention, the preferred thickness of the gold layer in the bonding pads 41 is between 90 μm to 120 μm to provide sufficient bonding support.

The load boards according to the present invention are especially suitable for the testing of packaged ICs with L-shaped or gullwing leads. The flat portions of the L-shaped or gullwing leads provide enough contact with the bonding pads on the load boards of the invention.

Third Embodiment

Figure 5A:
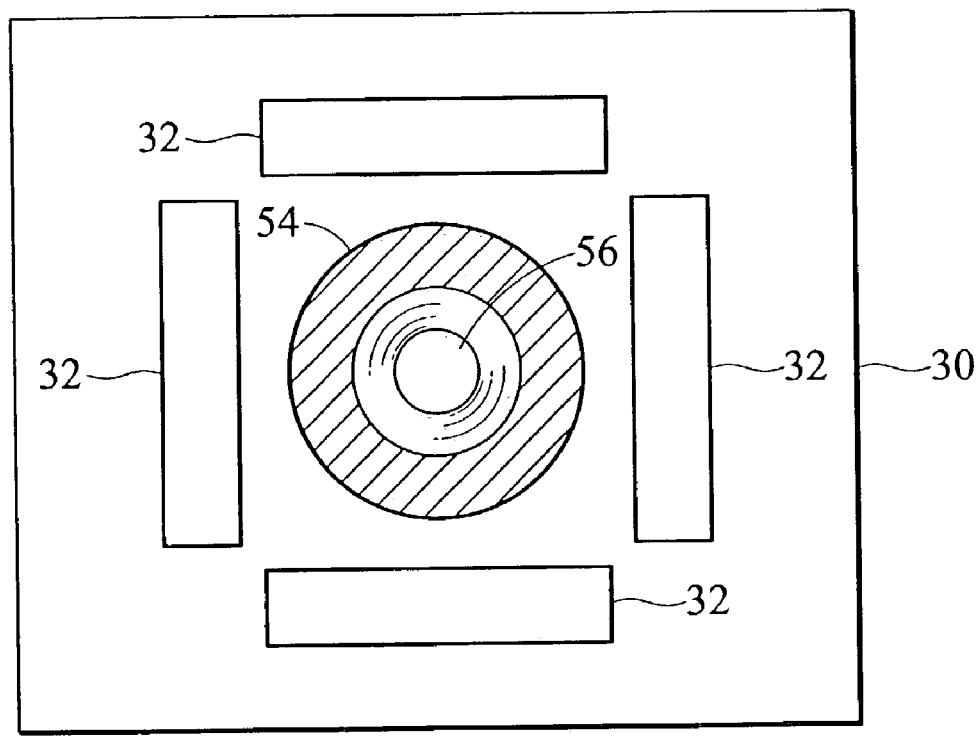
FIGS. 5A and 5B show a top view and a side view respectively of a load board of the invention bonding to a packaged IC with a suppresser.
Figure 5B:
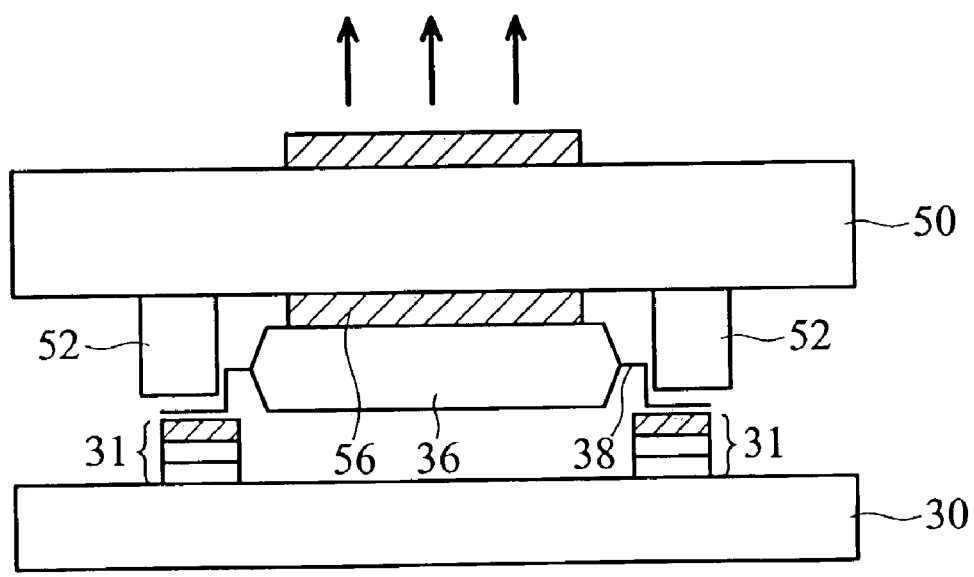

FIGS. 5A and 5B show implementation of a load board of the invention bonding in a packaged IC with a suppresser.

A load board 30 of the invention designed for a QFP IC with four bonding pad areas 32 thereon, as shown in FIG. 3A, is exemplified. A suppresser 50 comprises a suction unit 54 with a channel 56 in the center for vacuum suction. As shown in FIG. 5B, four soft pads 52 are disposed on the suppresser 50 each corresponding to a bonding pad area 32 on the load board 30.

When the QFP IC chip 36 is placed on the load board 30 and each lead 38 of the chip 36 is precisely in contact with corresponding bonding pad 31, the suppresser 50 is placed on the load board 30 with the suction unit 54 directly in the center of the testing IC 36. To perform IC testing, the suppresser 50 is pushed to the load board 30 and the four soft pads 52 suppress the leads 38 against the bonding pads 31. In addition, the flat bottom of the suction unit 54 also firmly attaches to the surface of the IC chip 36 by activating vacuum suction through the channel 56 during IC testing. After the testing is completed, the chip 36 is easily released from the suppresser 50 and the load board 30 by aeration through the channel 56.

Thus, the load boards according to the invention do not rely on extra sockets to connect testing ICs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A load board, comprising a testing circuit therein and a plurality of bonding pad areas on the surface thereof, wherein a plurality of bonding pads is disposed on the bonding pad areas, each of which is disposed corresponding to a lead of an IC for directly bonding thereto and composed of a copper layer, a nickel layer and a gold layer, where the gold layer has a sufficient thickness of around 90 μm to 120 μm to be directly bonded to the leads of the IC.

2. The load board as claimed in claim 1, comprising four bonding pad areas, whose areas correspond respectively to four sides of leads of the IC packaged by quad flat packaging (QFP).

3. The load board as claimed in claim 1, comprising two bonding pad areas, wherein the two bonding pad areas correspond respectively to two sides of leads of the IC packaged by dual inline package (DIP) or small outline packaging (SOP).

4. The load board as claimed in claim 1, wherein the bonding pads are formed for bonding to the packaged IC with L-shaped or gullwing leads.

* * * * *